United States Patent
Witters (10) Patent No.: US 9,070,712 B2
(45) Date of Patent: Jun. 30, 2015

(54) METHODS FOR MANUFACTURING A FIELD-EFFECT SEMICONDUCTOR DEVICE

(71) Applicant: IMEC, Leuven (BE)

(72) Inventor: Liesbeth Witters, Everburg (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/963,932

(22) Filed: Aug. 9, 2013

(65) Prior Publication Data

US 2014/0045315 A1  Feb. 13, 2014

(30) Foreign Application Priority Data

Aug. 10, 2012 (EP) .................................... 12180025

(51) Int. Cl.

| H01L 21/336 | (2006.01) |
|---|---|
| H01L 29/66 | (2006.01) |
| H01L 29/778 | (2006.01) |
| H01L 29/786 | (2006.01) |
| H01L 29/417 | (2006.01) |
| H01L 29/10 | (2006.01) |
| H01L 21/28 | (2006.01) |
| H01L 29/165 | (2006.01) |

(52) U.S. Cl.
CPC ..... *H01L 29/66545* (2013.01); *H01L 21/28255* (2013.01); *H01L 29/7781* (2013.01); *H01L 29/78684* (2013.01); *H01L 29/165* (2013.01); *H01L 29/41783* (2013.01); *H01L 29/6653* (2013.01); *H01L 29/6656* (2013.01); *H01L 29/66628* (2013.01); *H01L 29/1054* (2013.01)

(58) Field of Classification Search
USPC ................................................. 438/762, 933
See application file for complete search history.

(56) References Cited

U.S. PATENT DOCUMENTS

| 7,279,430 B2 * | 10/2007 | Chang et al. ................... 438/723 |
| 7,569,869 B2 * | 8/2009 | Jin et al. ......................... 257/190 |
| 7,915,608 B2 | 3/2011 | Hellings et al. |

(Continued)

FOREIGN PATENT DOCUMENTS

| KR | 100 849 072 B1 | 7/2008 |
| WO | WO 2012/087403 A1 | 6/2012 |
| WO | WO 2012/087404 A1 | 6/2012 |
| WO | WO 2012/087581 A2 | 6/2012 |
| WO | WO 2012/088097 A2 | 6/2012 |

OTHER PUBLICATIONS

European Search Report dated Jan. 17, 2013 for EP Application No. 12180025.4.

(Continued)

*Primary Examiner* — Chandra Chaudhari
(74) *Attorney, Agent, or Firm* — Knobbe, Martens, Olson & Bear LLP (57) ABSTRACT

A method of fabricating a field-effect transistor is disclosed. In one aspect, the method includes forming a channel layer comprising germanium over a substrate. The method additionally includes forming a gate structure on the channel layer, where the gate structure comprises a gate layer comprising silicon, and the gate layer has sidewalls above a surface of the channel layer. The method additionally includes forming sidewall spacers comprising silicon dioxide on the sidewalls by subjecting the gate structure to a solution adapted for forming a chemical silicon oxide on materials comprising silicon. The method further includes forming elevated source/drain structures on the channel layer adjacent to the gate structure by selectively epitaxially growing a source/drain material on the channel layer.

20 Claims, 5 Drawing Sheets

(56) References Cited

U.S. PATENT DOCUMENTS

| | | |
|---|---|---|
| 2006/0148182 A1 | 7/2006 | Datta et al. |
| 2007/0023795 A1 | 2/2007 | Nagano et al. |
| 2007/0287259 A1 | 12/2007 | Kavalieros et al. |
| 2007/0287260 A1 | 12/2007 | Yang et al. |
| 2007/0287261 A1 | 12/2007 | Raaijmakers et al. |
| 2011/0227157 A1 | 9/2011 | Yang et al. |
| 2012/0153387 A1 | 6/2012 | Murthy et al. |

OTHER PUBLICATIONS

Vita et al., "Analysis of power-performance for Ultra-Thin-Body Ge01 logic circuits," 2011 International Symposium on Low Power Electronics and Design (ISLPED), IEEE, pp. 115-120, Aug. 2011.

* cited by examiner

METHODS FOR MANUFACTURING A FIELD-EFFECT SEMICONDUCTOR DEVICE

CROSS-REFERENCE TO RELATED APPLICATIONS

Any and all priority claims identified in the Application Data Sheet, or any correction thereto, are hereby incorporated by reference under 37 CFR 1.57. This application claims foreign priority to European patent application EP 12180025.4 filed on Aug. 10, 2012, the contents of which is incorporated by reference herein in its entirety, and is hereby expressly made a part of this specification.

BACKGROUND OF THE INVENTION

1. Field of the Invention

The disclosed technology relates generally to methods of fabricating field-effect semiconductor devices, such as field-effect transistors (FETs), and more particularly to methods of fabricating field effect semiconductor devices using a replacement gate process.

2. Description of the Related Technology

Scaling of semiconductor devices to integrate more devices per unit area continue to pose new challenges. In particular, for scaling of field-effect transistors (FET), as gate lengths continue to scale down, the structural design of offset spacers, sometimes referred to as sidewall spacers, is becoming increasingly critical for transistor performance. The desired dimensions of such dielectric offset spacers designed to meet certain performance targets are becoming increasingly smaller and the corresponding process designs are becoming increasingly difficult in order to achieve the desired critical dimensions.

Therefore, there is a need to address the increased sensitivity to gate spacer dimensioning using process techniques for gate sidewall spacer formation, particularly in manufacturing processes following a gate-last approach, sometimes referred to as a "replacement gate" process or a "damascene gate" process.

US patent application, for example, 2007/0287259 A1 discloses the use of gate isolation spacers in a method of forming a semiconductor structure according to a replacement gate process.

Also, in US patent application 2006/0148182 A1, a self-aligned source/drain quantum well transistor or high charge carrier mobility transistor is formed using a replacement metal gate process, in which sidewall spacers temporarily bracket a dummy gate electrode.

Implant-free devices where source/drain (S/D) junctions are placed by an offset spacer, and which comprise doped source/drain regions epitaxially grown with limited diffusion, e.g. extremely thin silicon on insulator (ET-SOI) devices and implant free quantum well devices (e.g. U.S. Pat. No. 7,915,608 B2), show a very strong sensitivity towards the offset spacer critical dimension (CD). The offset spacer CD needs to be minimized to limit increase in external resistance and subsequent reduction in drive current, while it cannot be made too small to avoid high leakage between gate and drain. Careful process control is therefore desired. On 3D devices as for instance FINFET devices, this CD control along the FIN sidewall is even more challenging.

A problem with the current techniques for fabricating FET devices is still that they lack a precise control of the distance from the source/drain extensions to the gate edge.

SUMMARY OF CERTAIN INVENTIVE ASPECTS

It is an aim of the present disclosure to provide a method for fabricating a transistor device comprising a channel layer comprising germanium with improved offset spacer profile.

This aim is achieved according to the disclosure with a method showing the technical characteristics of the first independent claim.

In one aspect, the method includes forming a channel layer comprising germanium over a substrate. The method additionally includes forming a gate structure on the channel layer, where the gate structure comprises a gate layer comprising silicon, and the gate layer has sidewalls above a surface of the channel layer. The method additionally includes forming sidewall spacers comprising silicon dioxide on the sidewalls by subjecting the gate structure to a solution adapted for forming a chemical silicon oxide on materials comprising silicon. The method further includes forming elevated source/drain structures on the channel layer adjacent to the gate structure by selectively epitaxially growing a source/drain material on the channel layer.

According to another aspect, the method further includes removing germanium oxide formed on the channel layer.

According to another aspect, forming sidewall spacers and removing germanium oxide are carried out simultaneously by subjecting the gate structure and the channel layer to the solution.

It is an advantage that according to the above method, sidewall spacers can be formed in the form of silicon oxide, at the height of the silicon or SiGe layer of a gate structure, while at the same time the channel layer comprising germanium is precleaned and prepared for epitaxial growth of elevated source/drain areas. An auto-alignment thus takes place of the sidewall spacers. Moreover, the epitaxial growth of/for the elevated source/drain structures does not occur on the silicon oxide layer. In typical prior art spacer technology, SiN is used for these spacers, which can require the epitaxial growth to be selective with respect to SiN, which is less evident. It will be appreciated by the skilled person that FET transistor devices comprising a channel layer comprising germanium are often provided in combination with a shallow trench isolation (STI) structure which already comprises a silicon oxide and for which the epitaxial growth already has to be selective.

Advantageously, the method for fabricating a field-effect semiconductor device according to embodiments allows better control and design of the device performance characteristics (e.g. resistance, capacitance and gate-drain leakage) by providing a mechanism to increase precision control for defining the source and drain region distance to the gate electrode edges, e.g. for both overlap and underlap field-effect semiconductor device design. In that sense, the method according to the invention advantageously allows better repeatability of the field-effect semiconductor device performance characteristics.

The method according to embodiments can be advantageously applied for fabricating both planar devices, such as, for example, implant-free quantum well (IFQW) FET devices or silicon on oxide (SOI) pFET devices, and non-planar FET devices such as, for example, FinFET devices. Advantageously, in case of non-planar devices, the S/D-gate overlap/underlap distance along the FIN walls is more precisely controlled, and for example, a fixed external resistance (Rext) along the FIN walls is achieved.

The source/drain material can be undoped or in-situ doped. It can comprise SiGe (e.g., for NMOS), Ge or GeSn (e.g., for pMOS) or any other epitaxially grown layers known to be suitable to the skilled person.

In the following, when a reference is made to a silicon oxide layer, a layer is meant which comprises more than 90%, or more than 95%, or more than 99%, or more than 99.9%, or more than 99.99% of silicon oxide.

The gate structure comprising silicon (e.g., silicon or SiGe layer), which can be a dummy gate structure, can be amorphous or polycrystalline.

According to embodiments, providing the gate structure comprises providing a removable gate structure (RMG), comprising providing at least one dummy oxide layer, providing a dummy silicon or silicon germanium layer, e.g. a polycrystalline silicon layer, and providing at least one further dielectric layer.

According to embodiments, the method does not comprise providing a lateral spacer structure for the gate structure by means of patterning and dry etching.

It is an advantage of embodiments of the present invention that no dry etching is required for spacer definition and that due to its auto-aligning nature, alignment errors are non-existing.

According to embodiments, the method further comprises removing the at least one dummy oxide layer, the dummy silicon or silicon germanium layer, and the at least one dielectric layer, and providing a high-k dielectric layer in a corresponding gate area.

It is an advantage that the distance between gate and source/drain can be controlled perfectly. When applying a replacement gate process, the silicon or silicon germanium layer and any dielectric layers of the dummy gate stack can be aligned with the thus formed silicon oxide spacers. Moreover, the use of a high-k dielectric can further provide appropriate characteristics to the FET transistor device.

According to embodiments, the solution is adapted for removing germanium oxide, while not affecting silicon oxide.

According to embodiments, the solution comprises ozone and de-ionized water.

According to embodiments, the method further comprises subjecting the channel layer comprising germanium and the gate structure to de-ionized water which is substantially ozone-free.

According to embodiments, the method comprises forming the silicon oxide on the sidewalls at a level of the silicon or silicon germanium layer with a thickness larger than a single closed monolayer of silicon oxide. Preferably the thickness is smaller than about 3 nm, more preferably smaller than about 2 nm, even more preferably smaller than about 1 nm. Larger thicknesses are not excluded.

According to embodiments, the selectively epitaxially growing source/drain layer on the channel layer comprising germanium comprises only growing on the channel layer comprising germanium.

According to embodiments, the selectively epitaxially growing source/drain layer on the channel layer comprising germanium does not comprise growing on the gate structure nor on the oxide on the sidewalls of the gate structure.

According to embodiments, the method comprises providing further spacer structures in between the elevated source/drain structures and the oxide on the sidewalls of the gate structure, after providing the elevated source/drain structures on the channel layer comprising germanium.

This provides the advantages of further tuning the properties of the FET transistor device.

According to embodiments, the channel layer comprising germanium is a fin structure of a fin-FET device or similar 3D transistor device.

It will be appreciated that the isotropic nature of the wet processing by means of the solution provides the advantage of generating a constant offset between the doped source/drain areas and the channel all along the FIN sidewall.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof.

Thus, the scope of the expression "a device comprising A and B" should not be limited to devices consisting only of components A and B, rather with respect to the present disclosure, the only enumerated components of the device are A and B, and further the claim should be interpreted as including equivalents of those components.

Figure 1:
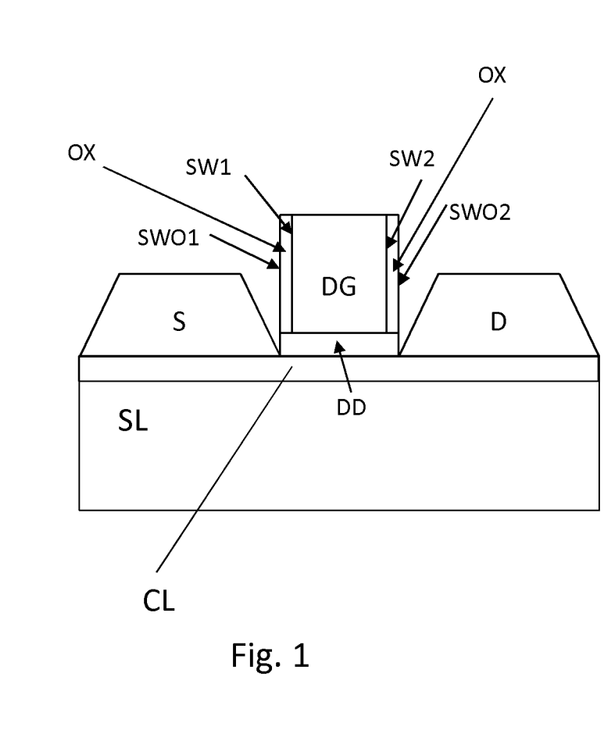
FIG. 1 illustrates a cross-sectional view of an intermediate structure of a field-effect transistor fabricated according to a first embodiment.

FIG. 1 is a cross-sectional view of a FET transistor device according to an embodiment of the disclosure at an early stage of manufacture, comprising a substrate layer SL with a channel layer or region CL, a source region S and a drain region D at opposite sides and adjacent to the channel region, and a dummy gate DG, comprising a dummy dielectric DD. A silicon oxide layer OX covers the lateral sidewall SW1, SW2 of a polycrystalline silicon layer in the dummy gate structure and defines the lateral sidewall SWO1, SWO2.

This device can be fabricated as follows, according to one embodiment:

A channel layer comprising germanium CL is deposited on a substrate layer SL, followed by a dummy dielectric deposition layer DD and the deposition of the DG amorphous silicon or polycrystalline silicon layer (alternatively a SiGe layer can for instance be used). The DG layer is subsequently patterned using a dry etch process that stops on the DD layer. The DD layer is subsequently removed selectively towards the DG and CL layer by either wet or dry processing. In case of a silicon oxide dielectric layer, DD can be removed by wet processing using hydrofluoric acid. At the point, the disclosure encompasses a cleaning step where the exposed silicon from DG is oxidized to a thin chemical $SiO_2$ layer OX, while the final $GeO_x$ grown on the exposed germanium CL is minimized, such that the subsequent selective epitaxial growth of the source S and drain D layer is only occurring on the exposed oxide-free Germanium CL layer and is blocked on the oxidized DG top and sidewalls. Hereby it is assumed that the top of the dummy gate is provided with a protecting oxide layer at the same time that the silicon oxide is formed on the sidewalls of the dummy gate silicon or silicon germanium. Alternatively, a separate step of applying a silicon oxide hard mask can be applied. on top of the silicon or silicon germanium of the dummy gate, as known in the art.

Figure 2:
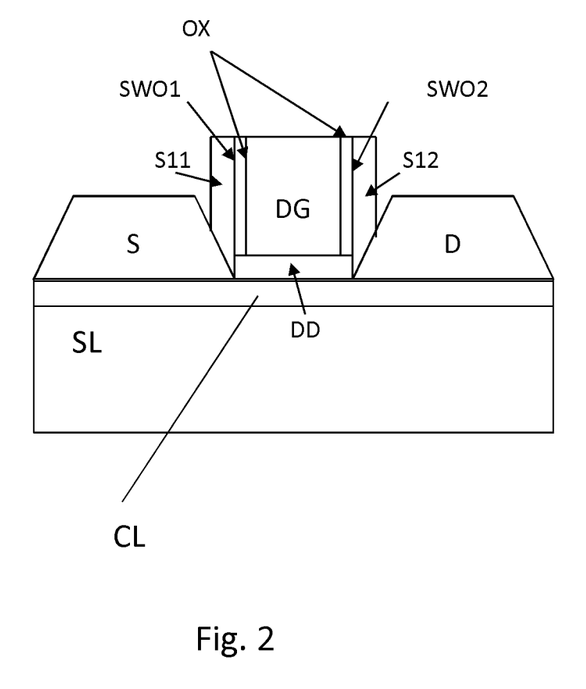
FIG. 2 illustrates a cross-sectional view of an intermediate structure of a field-effect transistor fabricated according to a second embodiment.

In FIG. 2 depicts the same device, whereby spacers S11 and S12 are provided on top of and/or adjacent or next to the oxidised sidewalls OX of the dummy gate structure, in order to further define the properties of the FET transistor device.

Spacers S11 and S12 are preferably made of a different material than DD and OX, so there is a sufficiently high selectivity of the wet removal of DD towards S11 and S12. These spacers S11 and S12 are deposited and anisotropically patterned after growth of the S and D layers. The main purpose of these spacers is to prevent a significant increase of the lateral size of the cavity left after the removal of the DG and DD layers and sidewall silicon oxide OX (replacement gate flow).

Figure 3:
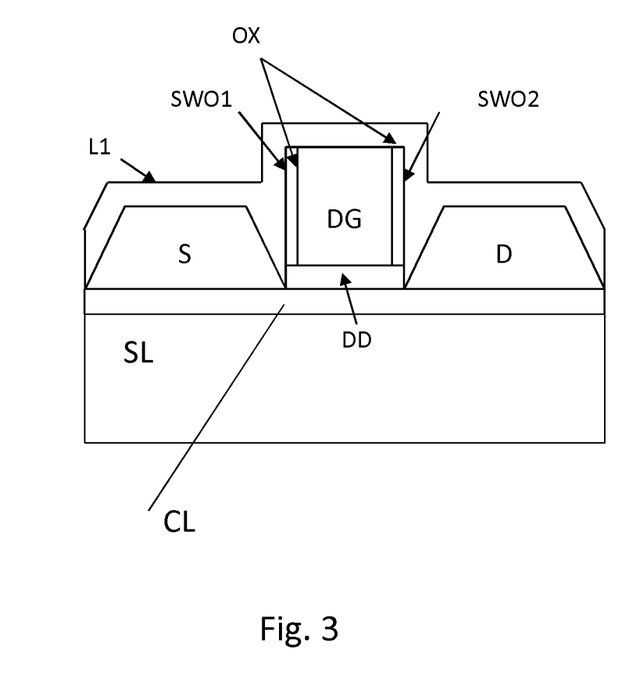
FIG. 3 illustrates a cross-sectional view of an intermediate structure of a field-effect transistor fabricated according to a third embodiment.

FIG. 3 illustrates a similar embodiment, wherein rather than patterning spacers to control the lateral size of the DG cavity, a uniform layer L1 can be deposited for the same purpose. This layer can for instance comprise silicon nitride.

Figure 4:
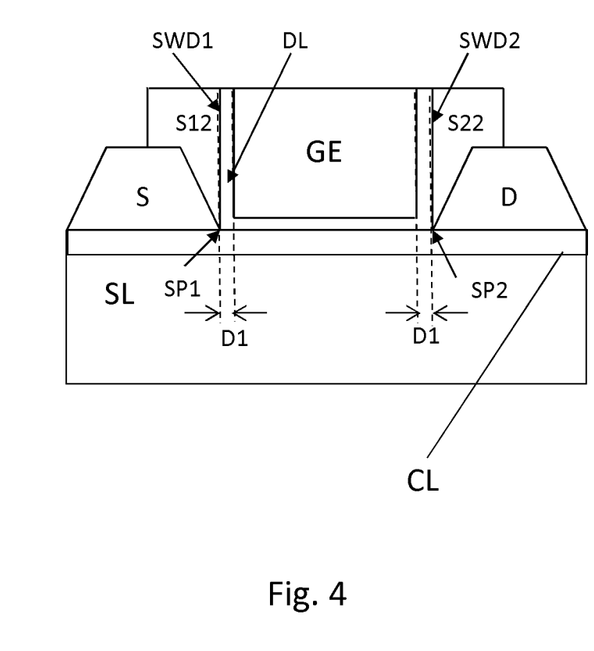
FIG. 4 illustrates a cross-sectional view of an intermediate structure of a field-effect transistor fabricated according to a fourth embodiment.

FIG. 4 illustrates another embodiment of the present invention after the replacement gate processing. After removal of the DG, DD, and OX layers from embodiment disclosed with respect to FIG. 2, selectively to S11 and S12 (which can for instance be a silicon nitride), the cavity is filled up with the final gate stack. The final gate stack consists of a dielectric layer DL, typically a high-k dielectric, and the final conductive gate stack material GE. As such, a combination has been made with a so-called removable gate, high-k last, flow. The dummy gate DG, including its gate dielectric DD and the oxide formed at the sidewalls of the silicon layer have been removed and are replaced by a high-k dielectric, defining sidewalls SWD1, SWD2. The final offset between the GE edge and the doped S and D layers is provided by the dielectric thickness D1. The well controlled deposition of the DL layer allows for a well-controlled underlap or overlap of the dopants under the gate stack GE, depending on the diffusion of the dopants during the rest of the processing.

Figure 5:
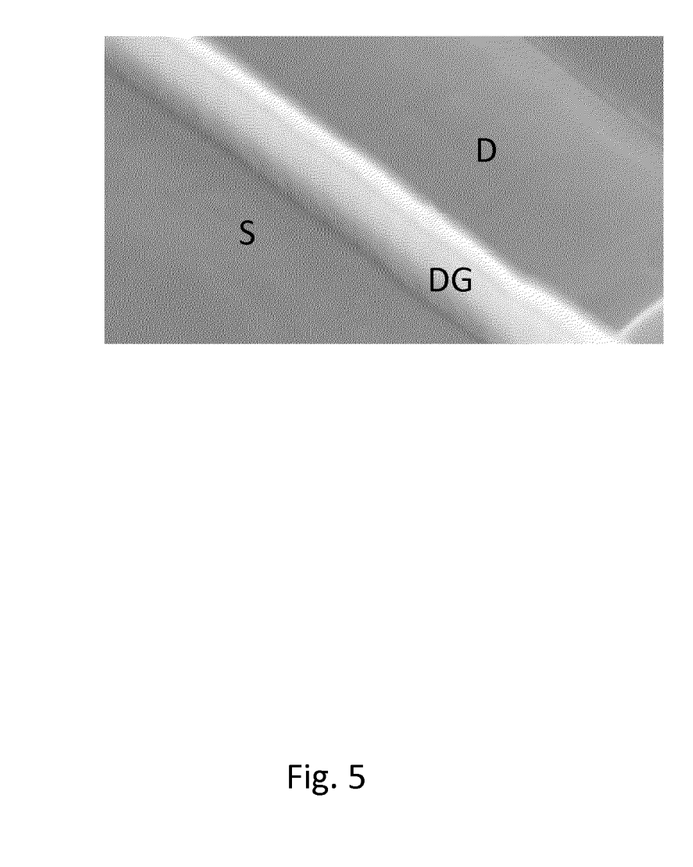
FIG. 5 shows a top view SEM image of an intermediate structure of a field-effect transistor fabricated according to one embodiment, taken after formation of source (S) and drain (D) on a silicon substrate wafer.
Figure 6:
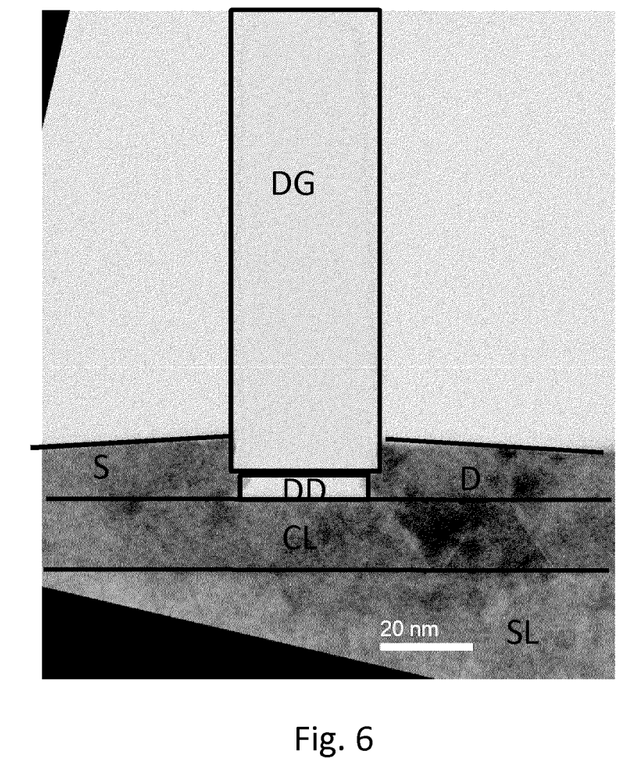
FIG. 6 shows a cross-section TEM image of an intermediate structure of a field-effect transistor fabricated according to one embodiment, taken after formation of source (S) and drain (D) on a silicon substrate wafer.

FIGS. 5 and 6 show a top view SEM and cross-section TEM image after growth of source (S) and drain (D) layers on a silicon substrate wafer. FIG. 6 corresponds to the embodiments described with respect to FIG. 1. In this experiment, layer SL is a thick relaxed SiGe layer, grown epitaxially on a silicon substrate. CL is a germanium layer deposited epitaxially on the SiGe SL layer. DD is a 5 nm thick silicon oxide layer. The dummy gate layer DG is a 100 nm thick dry patterned amorphous silicon layer. After wet removal of the DD layer, a ozone ($O_3$)/deionized water (DIW) cleaning step and a O-free DIW cleaning step were performed. This was followed by the epitaxial growth of a 10 nm thick S and D germanium layer. As described in the disclosure, the S and D layer is grown only on the exposed CL layer, while no growth has occurred on the DG layer nor OX layer. The TEM image shows the presence of oxide at the sidewalls of the dummy gate structure.

In summary, due to the different material of the dummy polycrystalline silicon (poly-Si) or SiGe gate and germanium channel, selective oxidation of the poly-Si or SiGe gate relative to the germanium active region can be applied before epitaxial source/drain deposition. An example is the use of an $O_3$/DIW rinse and preferably followed also by a $O_3$-free DIW wet rinse, which creates a chemical oxide on the silicon or SiGe gate but leaves the germanium surface germanium oxide free. In-situ doped epitaxially grown S/D can therefore selectively be grown towards the gate without the need of an off-set spacer encapsulation after this $O_3$/DIW clean and optionally O-free DIW clean, as is typically employed in the prior art. This is especially attractive on 3D devices as for instance FINFET devices, where the isotropic wet treatment allows for a constant offset between the S/D epitaxial layers and dummy gate, all along the FIN sidewall. In the subsequent RMG-high-k-last flow, the high-k deposition provides a well-controlled offset between S/D dopants and channel.

A generic feature for embodiments of the present invention is the use of a selective low temperature oxidation process prior to epitaxial growth on S/D regions. On the germanium channel device, an example of such treatment is a wet chemical clean in $O_3$/deionised water (DIW). The selective oxidation of poly-Si relative to germanium results in no growth on the poly-Si gate and the oxide layer at its sidewall, while an in-situ doped epitaxial layer is grown on the germanium S/D regions. As such, an off-set spacer formation process is not needed to align the S/D doped epitaxial layer to the poly-Si gate.

In combination with a RMG-HKL flow, the minimal separation between the RMG metal gate material and S/D junctions is controlled by the deposited high-k thickness. The overlap between S/D junctions and gate can further be enhanced by controlling the loss of the contact etch stop layer (CESL, L1) or $2^{nd}$ spacer material in combination with an optional diffusion of the S/D dopants. Preferably this loss due to non-perfect selectivity of the removal step does not remove more than 2 nm of the contact etch stop layer (CESL, L1) or $2^{nd}$ spacer material in the lateral dimension or width direction of the gate structure.

What is claimed is:

1. A method of fabricating a field-effect transistor (FET) device, comprising:
   forming a channel layer comprising germanium over a substrate;
   forming a gate structure on the channel layer, the gate structure comprising a patterned gate layer comprising silicon, the gate layer having sidewalls above a surface of the channel layer;
   subjecting the gate structure and surfaces of the channel layer to a solution, wherein the subjecting selectively oxidizes the sidewalls of the gate layer to form sidewall spacers comprising a chemical silicon oxide thereon while preventing formation of germanium oxide on the surfaces of the channel layer, thereby forming oxide-free surfaces of the channel layer laterally adjacent the gate layer; and
   forming elevated source/drain structures on the channel layer adjacent to the gate structure by selectively epitaxially growing a source/drain material on the oxide-free surfaces of the channel layer.

2. The method of claim 1, wherein the subjecting further comprises removing germanium oxide formed on the channel layer adjacent the gate layer.

3. The method of claim 2, wherein forming the sidewall spacers and removing germanium oxide are carried out simultaneously by subjecting the gate structure and the channel layer to the solution.

4. The method of claim 1, wherein forming the gate structure comprises forming a removable gate structure, comprising:
   providing at least one removable gate dielectric layer on the channel layer;
   providing the gate layer that is a removable gate layer on the removable gate dielectric layer; and
   providing at least one dielectric layer over the gate layer.

5. The method of claim 4, wherein forming the sidewall spacers completes a spacer formation process such that the spacer formation process does not further include providing a lateral spacer structure for the gate structure by dry etching.

6. The method of claim 4, wherein forming the gate structure further comprises removing the removable gate structure, which includes removing the at least one removable gate dielectric layer, the removable gate layer, and the at least one dielectric layer, and
   wherein forming the gate structure further comprises depositing a high-k dielectric layer over a surface formed by removing the removable gate structure.

7. The method of claim 2, wherein the solution is adapted for removing germanium oxide, while substantially not removing silicon oxide.

8. The method of claim 7, wherein the solution comprises ozone and de-ionized water.

9. The method of claim 8, further comprising further subjecting the channel layer and the gate structure to de-ionized water which is substantially ozone-free.

10. The method of claim 1, wherein forming the sidewall spacers comprises forming the chemical silicon oxide on the sidewalls having a thickness larger than about a single monolayer of silicon oxide.

11. The method of claim 1, wherein forming the sidewall spacers comprises forming the chemical silicon oxide on the sidewalls having a thickness less than about 3 nm.

12. The method of claim 1, wherein selectively epitaxially growing the source/drain material comprises only growing on the oxide-free surfaces of the channel layer.

13. The method of claim 1, wherein selectively epitaxially growing the source/drain material does not include growing the source/drain material on the gate structure nor on the sidewall spacers.

14. The method of claim 6, further comprising forming additional spacer structures between the elevated source/drain structures and the sidewall spacers, after forming the elevated source/drain structures and prior to removing the removable gate structure.

15. The method of claim 1, wherein the FET is a fin-FET transistor device comprising a fin-shaped channel structure, wherein the channel structure comprises the channel layer.

16. The method of claim 14, further comprising removing the sidewall spacers after forming the additional spacer structures and prior to removing the sacrificial gate structure.

17. A method of fabricating a field-effect transistor, comprising:
   forming on a substrate a channel layer comprising germanium;
   patterning a sacrificial gate layer comprising silicon on the channel layer;
   exposing sidewalls of the patterned sacrificial gate layer to a solution to form thereon sacrificial sidewall spacers comprising chemical silicon oxide;
   forming an elevated source and an elevated drain on exposed surfaces of the channel layer laterally adjacent the patterned sacrificial gate layer;
   after forming the elevated source and drain, forming permanent sidewall spacers on the sacrificial sidewall spacers;
   removing the sacrificial gate layer and the sacrificial sidewall spacers, thereby forming a cavity comprising an exposed channel surface and exposed inner surfaces of the permanent sidewall spacers; and
   depositing a permanent gate dielectric layer on the exposed channel surface of the cavity and depositing a permanent gate metal on the permanent gate dielectric layer.

18. The method of claim 17, wherein exposing sidewalls of the patterned sacrificial gate layer to the solution also exposes surfaces of the channel layer adjacent the patterned sacrificial gate layer to the solution, wherein exposing selectively oxidizes the sidewalls to form the chemical silicon oxide while preventing formation of germanium oxide on the channel layer, thereby forming oxide-free surfaces of the channel layer laterally adjacent the patterned sacrificial gate layer.

19. The method of claim 18, wherein forming the elevated source and the elevated drain comprises growing by selective epitaxy on the oxide-free surfaces of the channel layer laterally adjacent the patterned sacrificial gate layer.

20. The method of claim 18, wherein the solution comprises $O_3$ and deionized water.

* * * * *